United States Patent [19]

Liao et al.

[11] Patent Number: 6,127,238
[45] Date of Patent: Oct. 3, 2000

[54] PLASMA ENHANCED CHEMICAL VAPOR DEPOSITED (PECVD) SILICON NITRIDE BARRIER LAYER FOR HIGH DENSITY PLASMA CHEMICAL VAPOR DEPOSITED (HDP-CVD) DIELECTRIC LAYER

[75] Inventors: Marvin De-Dui Liao; Kho Liep Chok; Jia Zhen Zheng; Wei Lu; Yih-Shung Lin, all of Singapore, Singapore

[73] Assignee: Chartered Semiconductor Manufacturing Ltd., Singapore, Singapore

[21] Appl. No.: 09/266,373

[22] Filed: Mar. 11, 1999

[51] Int. Cl.[7] ................................................. H01L 21/20
[52] U.S. Cl. .......................... 438/382; 438/763; 438/689; 438/693
[58] Field of Search ...................... 438/763, 783, 438/706, 734, 437, 700; 257/644; 427/126.1

[56] References Cited

U.S. PATENT DOCUMENTS

| | | | |
|---|---|---|---|
| 5,494,854 | 2/1996 | Jain | 437/195 |
| 5,605,859 | 2/1997 | Lee | 437/60 |
| 5,679,606 | 10/1997 | Wang et al. | 437/195 |
| 5,885,894 | 3/1999 | Wu et al. | 438/763 |
| 5,888,844 | 3/1999 | Bestwick | 438/706 |
| 5,904,523 | 5/1999 | Feldman et al. | 438/763 |
| 5,980,766 | 11/1999 | Flamn | 438/706 |
| 5,997,634 | 12/1999 | Sandhu et al. | 427/126.1 |
| 6,008,137 | 12/1999 | Lee | 438/734 |
| 6,033,970 | 3/2000 | Park | 438/437 |
| 6,034,420 | 3/2000 | Tran | 257/644 |
| 6,054,340 | 4/2000 | Mitchell | 438/700 |
| 6,063,713 | 5/2000 | Doan | 438/763 |
| 6,069,063 | 5/2000 | Chang et al. | 438/783 |

OTHER PUBLICATIONS

Chang et al., "ULSI Technology", The McGraw–Hill Companies, Inc, NY, 1996, pp. 260–261.

*Primary Examiner*—Richard Booth
*Assistant Examiner*—André C. Stevenson
*Attorney, Agent, or Firm*—George O. Saile; Rosemary L. S. Pike; Alek P. Szecsy

[57] ABSTRACT

A method for forming a dielectric layer within a microelectronics fabrication. There is first provided a substrate. There is then formed over the substrate a polysilicon resistor. There is then formed over the polysilicon resistor a first dielectric layer formed of a silicon nitride dielectric material deposited employing a plasma enhanced chemical vapor deposition (PECVD) method other than a high density plasma chemical vapor deposition (HDP-CVD) method. Finally, there is then formed over the first dielectric layer a second dielectric layer deposited employing a high density plasma chemical vapor deposition (HDP-CVD) method, where first dielectric layer attenuates a decrease in resistance of the polysilicon resistor incident to forming the second dielectric layer over the first dielectric layer.

9 Claims, 2 Drawing Sheets

PLASMA ENHANCED CHEMICAL VAPOR DEPOSITED (PECVD) SILICON NITRIDE BARRIER LAYER FOR HIGH DENSITY PLASMA CHEMICAL VAPOR DEPOSITED (HDP-CVD) DIELECTRIC LAYER

BACKGROUND OF THE INVENTION

1. Field of the Invention

The present invention relates generally to dielectric layers formed within microelectronics fabrications. More particularly, the present invention relates to barrier dielectric layers formed within microelectronics fabrications.

2. Description of the Related Art

Microelectronics fabrications are formed from microelectronics substrates over which are formed patterned microelectronics conductor layers which are separated by microelectronics dielectric layers.

As microelectronics fabrication integration levels have increased and microelectronics fabrication device and patterned conductor layer dimensions have decreased, it has become increasingly more important to form within microelectronics fabrications narrow linewidth dimension and/or narrow pitch dimension microelectronics devices and patterned microelectronics conductor layers which have formed interposed therebetween void free, gap filling and planarizing microelectronics dielectric layers.

Of the methods which may be employed for forming void free, gap filling and planarizing microelectronics dielectric layers interposed between the patterns of narrow linewidth dimension and/or narrow pitch dimensions microelectronics devices and patterned microelectronics conductor layers within microelectronics fabrications, high density plasma chemical vapor deposition (HDP-CVD) methods have recently received increased attention. High density plasma chemical vapor deposition (HDP-CVD) methods are characterized as plasma enhanced chemical vapor deposition (PECVD) methods undertaken simultaneously with sputtering methods, where the deposition rates within the plasma enhanced chemical vapor deposition (PECVD) methods are greater than that sputtering rates within the sputtering methods. Such high density plasma chemical vapor deposition (HDP-CVD) methods typically employ plasma enhanced chemical vapor deposition (PECVD) methods as are generally known in the art of microelectronics fabrication, typically undertaken simultaneously with bias sputtering methods employing argon sputtering ions. Dielectric materials which may be formed into dielectric layers while employing high density plasma chemical vapor deposition (HDP-CVD) methods include but are not limited to silicon oxide dielectric materials, silicon nitride dielectric materials and silicon oxynitride dielectric materials.

Although high density plasma chemical vapor deposition (HDP-CVD) methods are thus desirable within the art of microelectronics fabrication for forming void free, gap filling and planarizing dielectric layers interposed between the patterns of narrow linewidth dimension and/or narrow pitch dimension microelectronics devices or patterned microelectronics conductor layers within microelectronics fabrications, high density plasma chemical vapor deposition (HDP-CVD) methods are not entirely without problems when forming void free, gap filling and planarizing dielectric layers within microelectronics fabrications. In particular, due to the intensity of a bias sputtering component typically employed within a high density plasma chemical vapor deposition (HDP-CVD) method, microelectronics devices and/or patterned microelectronics conductor layers formed beneath dielectric layers formed employing high density plasma chemical vapor deposition (HDP-CVD) methods often sustain high density plasma induced degradation incident to forming those high density plasma chemical vapor deposited (HDP-CVD) dielectric layers. The high density plasma induced degradation may be evidenced as either physical damage to, or compromised operating parameters of, patterned microelectronics conductor layers or microelectronics devices formed beneath those high density plasma chemical vapor deposited (HDP-CVD) dielectric layers.

It is thus towards the goal of forming within microelectronics fabrications high density plasma chemical vapor deposited (HDP-CVD) dielectric layers with attenuated degradation of microelectronics devices and patterned microelectronics conductor layers fabricated beneath those high density plasma chemical vapor deposited (HDP-CVD) dielectric layers incident to forming those high density plasma chemical vapor deposited (HDP-CVD) dielectric layers that the present invention is directed.

Various methods have been disclosed in the art of microelectronics fabrication for forming dielectric layers with desirable properties within microelectronics fabrications.

For example, Cheng, in ULSI Technology, Chang et al., eds., Mc-Graw-Hill (New York: 1996), pp. 260–61, discloses both a conventional spin-on-glass (SOG) method for forming within an integrated circuit microelectronics fabrication a planarizing inter-metal dielectric (IMD) layer and an electron cyclotron resonance chemical vapor deposition (ECR-CVD) high density plasma chemical vapor deposition (HDP-CVD) method for forming within an integrated circuit microelectronics fabrication a planarizing inter-metal dielectric (IMD) layer.

In addition, Jain et al., in U.S. Pat. No. 5,494,854, discloses a method for forming with enhanced throughput, gap-filling capability, planarity and uniformity within a microelectronics fabrication a chemical mechanical polish (CMP) planarized dielectric layer upon a patterned conductor layer whose conductor patterns are of varying aspect ratio. The method employs a high density plasma chemical vapor deposition (HDP-CVD) method to form a first dielectric layer which planarizes the high aspect ratio, but not necessarily the low aspect ratio, conductor patterns within the patterned conductor layer, where the first dielectric layer subsequently has formed thereupon a second dielectric layer formed of a dielectric material which is more readily planarized within the chemical mechanical polish (CMP) method than the first dielectric layer.

Further, Lee, in U.S. Pat. No. 5,605,859, discloses an insulator structure for use within an integrated circuit microelectronics fabrication, where the insulator structure maintains the integrity of a polysilicon resistor formed within the insulator structure within the integrated circuit microelectronics fabrication. The insulator structure employs a silicon oxide dielectric layer formed as a barrier layer interposed between the polysilicon resistor and an overlying dielectric layer formed within the integrated circuit microelectronics fabrication, where the silicon oxide dielectric layer is formed employing a plasma enhanced chemical vapor deposition (PECVD) method employing silane as a silicon source material.

Finally, Wang et al., in U.S. Pat. No. 5,679,606, discloses an electron cyclotron resonance high density plasma chemical vapor deposition (ECR-HDP-CVD) method for forming with attenuated patterned conductor layer damage an electron cyclotron resonance high density plasma chemical vapor deposited (ECR-HDP-CVD) dielectric layer upon a patterned conductor layer within a microelectronics fabrication. Within the method, an argon flow employed within a sputtering component within the electron cyclotron resonance high density plasma chemical vapor deposition (ECR-HDP-CVD) method is cycled off and on to form an initial deposit of an electron cyclotron resonance chemical vapor deposited (ECR-CVD) silicon oxide dielectric layer, but not an electron cyclotron resonance high density plasma chemical vapor deposited (ECR-HDP-CVD) dielectric layer, in order to attenuate patterned conductor layer damage when forming the electron cyclotron resonance high density plasma chemical vapor deposited (ECR-HDP-CVD) dielectric layer upon the patterned conductor layer.

Desirable in the art of microelectronics fabrication are additional methods for forming high density plasma chemical vapor deposited (HDP-CVD) dielectric layers with attenuated degradation to microelectronics devices and patterned microelectronics conductor layers formed beneath those high density plasma chemical vapor deposited (HDP-CVD) dielectric layers incident to forming those high density plasma chemical vapor deposited (HDP-CVD) dielectric layers. It is towards that goal that the present invention is directed.

SUMMARY OF THE INVENTION

A first object of the present invention is to provide a high density plasma chemical vapor deposition (HDP-CVD) method for forming within a microelectronics fabrication a dielectric layer.

A second object of the present invention is to provide a method in accord with the first object of the present invention, where there is attenuated high density plasma chemical vapor deposition (HDP-CVD) induced degradation of microelectronics devices and patterned microelectronics conductor layers formed beneath the high density plasma chemical vapor deposited (HDP-CVD) dielectric layer incident to forming the high density plasma chemical vapor deposited (HDP-CVD) dielectric layer.

A third object of the present invention is to provide a method in accord with the first object of the present invention and the second object of the present invention, which method is readily commercially implemented.

In accord with the objects of the present invention, there is provided a method for forming a high density plasma chemical vapor deposited (HDP-CVD) dielectric layer within a microelectronics fabrication. To practice the method of the present invention, there is first provided a substrate. There is then formed over the substrate a polysilicon resistor. There is then formed over the polysilicon resistor a first dielectric layer formed of a silicon nitride dielectric material deposited employing a plasma enhanced chemical vapor deposition (PECVD) method other than a high density plasma chemical vapor deposition (HDP-CVD) method. Finally, there is then formed over the first dielectric layer a second dielectric layer deposited employing a high density plasma chemical vapor deposition (HDP-CVD) method, where first dielectric layer is formed employing deposition conditions which attenuate a decrease in resistance of the polysilicon resistor incident to forming the second dielectric layer over the first dielectric layer.

The present invention provides a high density plasma chemical vapor deposition (HDP-CVD) method for forming within a microelectronics fabrication a dielectric layer, where there is attenuated high density plasma chemical vapor deposition (HDP-CVD) induced degradation of microelectronics devices and patterned microelectronics conductor layers formed beneath the high density plasma chemical vapor deposited (HDP-CVD) dielectric layer incident to forming the high density plasma chemical vapor deposited (HDP-CVD) dielectric layer. The method of the present invention realizes this object by forming interposed between the high density plasma chemical vapor deposited (HDP-CVD) dielectric layer and the microelectronics devices or patterned microelectronics conductor layers a silicon nitride layer formed employing a plasma enhanced chemical vapor deposition (PECVD) method other than a high density plasma chemical vapor deposition (HDP-CVD) method. Within the present invention, the microelectronics devices whose high density plasma chemical vapor deposition (HDP-CVD) induced degradation is attenuated comprise a polysilicon resistor.

The method of the present invention is readily commercially implemented. The method of the present invention employs methods and materials as are otherwise generally known in the art of microelectronics fabrication. Since it is a novel ordering of methods and process controls for forming layers with desirable properties within microelectronics fabrications which provides at least in part the method of the present invention, rather than the existence of specific methods and materials which provides the method of the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronics fabrication a dielectric layer formed employing a high density plasma chemical vapor deposition (HDP-CVD) method, where there is attenuated high density plasma induced degradation of microelectronics devices and patterned microelectronics conductor layers formed beneath the dielectric layer incident to forming the dielectric layer while employing the high density plasma chemical vapor deposition (HDP-CVD) method. The method of the present invention realizes the foregoing object by forming interposed between: (1) the microelectronics devices and patterned microelectronics conductor layers; and (2) the dielectric layer formed employing the high density plasma chemical vapor deposition (HDP-CVD) method a second dielectric layer formed of a silicon nitride dielectric material formed employing a plasma enhanced chemical vapor deposition (PECVD) method other than a high density plasma chemical vapor deposition (HDP-CVD) method. The present invention is particularly directed towards attenuating high density plasma induced resistance decreases of polysilicon resistors within microelectronics fabrications incident to forming over those polysilicon resistors within those microelectronics fabrications dielectric layers formed employing high density plasma chemical vapor deposition (HDP-CVD) methods.

Although the method of the present invention provides particular value in attenuating resistance decreases of polysilicon resistors formed beneath high density plasma chemical vapor deposited (HDP-CVD) dielectric layers, and in particular high density plasma chemical vapor deposited (HDP-CVD) silicon oxide dielectric layers formed employing silane as a silicon source material, within integrated circuit microelectronics fabrications, the method of the present invention may also be employed in forming high density plasma chemical vapor deposited (HDP-CVD) dielectric layers with attenuated degradation to microelectronics devices, and in particular polysilicon resistors, formed beneath those high density plasma chemical vapor deposited (HDP-CVD) dielectric layers incident to forming those high density plasma chemical vapor deposited (HDP-CVD) dielectric layers within microelectronics fabrications including but not limited to integrated circuit microelectronics fabrications, solar cell microelectronics fabrications, ceramic substrate microelectronics fabrications and flat panel display microelectronics fabrications.

Figure 1:
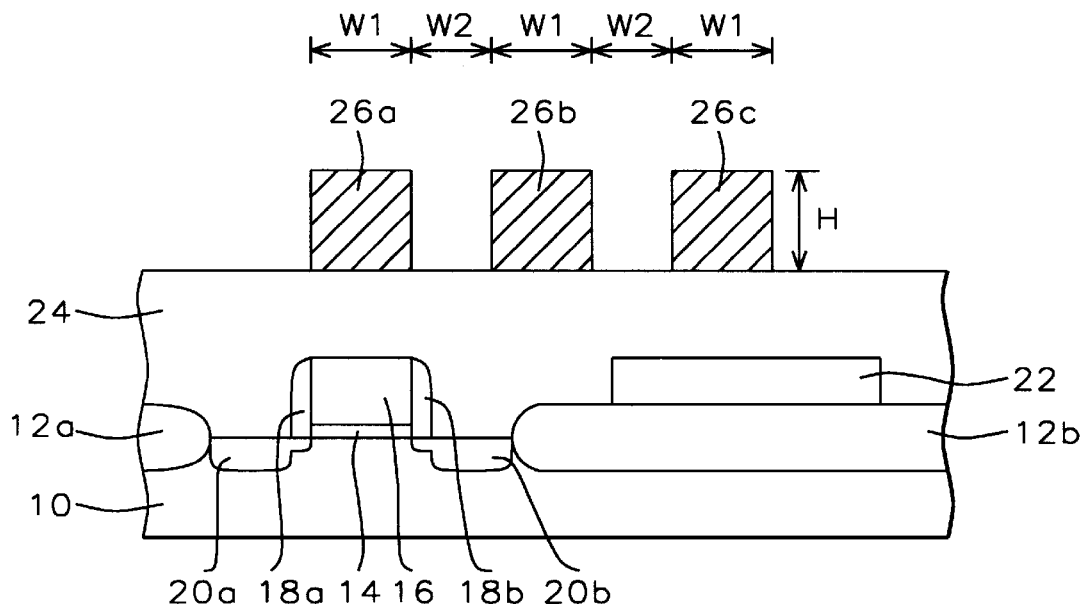
FIG. 1, FIG. 2 and FIG. 3 show a series of schematic cross-sectional diagrams illustrating the results of progressive stages in forming within an integrated circuit microelectronics fabrication a high density plasma chemical vapor deposited (HDP-CVD) dielectric layer in accord with a preferred embodiment of the present invention.
Figure 2:
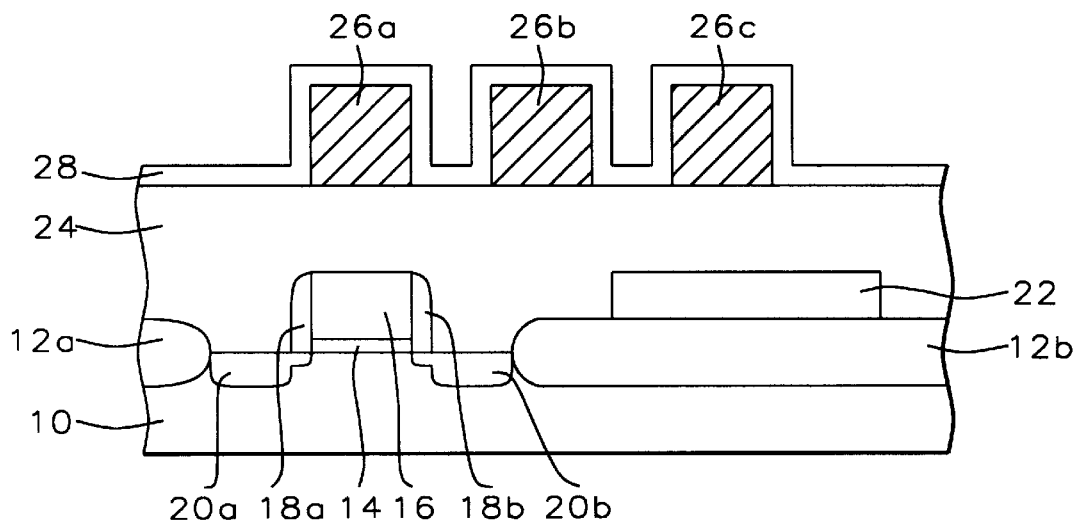
Figure 3:
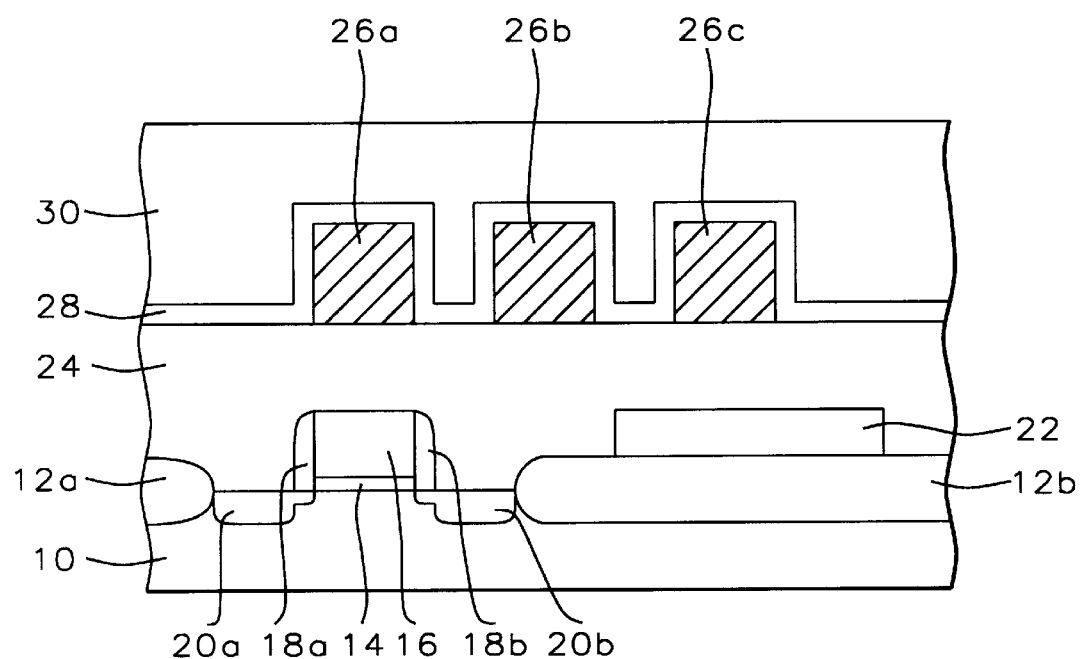

Referring now to FIG. 1 to FIG. 3, there is shown a series of schematic cross-sectional diagrams illustrating the results of progressive stages in forming within a microelectronics fabrication in accord with a preferred embodiment of the present invention a dielectric layer formed employing a high density plasma chemical vapor deposition (HDP-CVD) method. Shown in FIG. 1 is a schematic cross-sectional diagram of the microelectronics fabrication at an early stage in its fabrication.

Shown in FIG. 1 is a semiconductor substrate 10 having formed therein and thereupon a pair of isolation regions 12a and 12b which define an active region of the semiconductor substrate 10. Although semiconductor substrates are known in the art with either dopant polarity, various dopant concentrations and several crystallographic orientations, for the preferred embodiment of the present invention, the semiconductor substrate 10 is preferably a (100) silicon semiconductor substrate having an N- or P-doping.

Similarly, although it is also known in the art of integrated circuit microelectronics fabrication that isolation regions may be formed within and upon semiconductor substrates to define active regions of those semiconductor substrates employing methods including but not limited to isolation thermal growth methods and isolation regions deposition/patterning methods, for the preferred embodiment of the present invention, the isolation regions 12a and 12b are preferably formed within and upon the semiconductor substrate 10 to define the active region of the semiconductor substrate 10 employing an isolation region thermal growth method at a temperature of from about 1000 to about 1100 degrees centigrade to form the isolation regions 12a and 12b of silicon oxide within an upon the semiconductor substrate 10.

Shown also within FIG. 1 formed within the active region of the semiconductor substrate 10 as defined by the isolation regions 12a and 12b is a series of structures which comprises a field effect transistor (FET). The series of structures includes: (1) a gate dielectric layer 14 having formed and aligned thereupon; (2) a gate electrode 16; (3) a pair of dielectric spacer layers 18a and 18b formed adjoining a pair of opposite edges of the gate dielectric layer 14 and the gate electrode 16; and (4) a pair of source/drain regions 20a and 20b formed into the active region of the semiconductor substrate at areas not covered by the gate dielectric layer 14 and the gate electrode 16. Each of the foregoing structures which forms the field effect transistor (FET) may be formed employing methods and materials as are conventional in the art of field effect transistor (FET) fabrication.

For example, the gate dielectric layer 14 is typically and preferably formed upon the active region of the semiconductor substrate 10 employing a gate dielectric layer thermal growth method at a temperature of from about 800 to about 850 degrees centigrade to form the gate dielectric layer 14 of silicon oxide of thickness about 45 to about 70 angstroms. Similarly, the gate electrode 16 is typically and preferably formed of a doped polysilicon or polycide (doped polysilicon/metal silicide stack) gate electrode material formed employing a chemical vapor deposition (CVD) method, as is similarly conventional in the art of integrated circuit microelectronics fabrication, to form the gate electrode 16 of thickness about 2500 to about 3800 angstroms. Yet similarly, the dielectric spacer layers 18a and 18b are typically and preferably formed employing anisotropic etching of a blanket dielectric layer formed of a silicon oxide dielectric material, a silicon oxide dielectric material or a silicon oxynitride dielectric material. Finally, the source/drain regions 20a and 20b are typically and preferably formed employing: (1) a low dose ion implant employing an ion implantation dose of from about 4E13 to about 6E13 ions per square centimeter and an ion implantation energy of from about 15 to about 20 keV while employing the gate dielectric layer 14 and the gate electrode 16 as a mask, followed by; (2) a high dose ion implant employing an ion implantation dose of from about 1E15 to about 3E15 ions per square centimeter and an ion implantation energy of from about 30 to about 60 keV while employing the gate dielectric layer 14, the gate electrode 16 and the dielectric spacer layers 18a and 18b as a mask.

Also shown in FIG. 1 is a polysilicon resistor 22 formed upon the isolation region 12b. Although the polysilicon resistor 22 formed upon the isolation region 12b as illustrated within the schematic cross-sectional diagram of FIG. 1 may be formed employing methods and materials as are conventional in the art of microelectronics fabrication, the polysilicon resistor 22 is typically and preferably, although not exclusively, not formed of the same polysilicon material as the gate electrode 16, since the polysilicon resistor 22 is typically and preferably formed with a higher resistance than the gate electrode 16. Preferably, the polysilicon resistor 22 is formed to a thickness of from about 500 to about 550 angstroms from a sufficiently doped polysilicon material to form the polysilicon resistor 22 of resistance from about 50 to about 250 Gohms per load. Most typically, although not exclusively, the polysilicon material is formed employing a chemical vapor deposition (CVD) method.

Shown also within FIG. 1 formed over the semiconductor substrate 10 including the polysilicon resistor 22 and the series of structures which forms the field effect transistor (FET) is a blanket planarized pre-metal dielectric (PMD) layer 24. Finally, there is shown in FIG. 1 formed upon the blanket planarized pre-metal dielectric (PMD) layer 24 a series of patterned first conductor layers 26a, 26b and 26c. Similarly with the series of structures which forms the field effect transistor (FET), the blanket planarized pre-metal dielectric (PMD) layer 24 and the patterned first conductor layers 26a, 26b and 26c may also be formed employing methods and materials as are conventional in the art of integrated circuit microelectronics fabrication.

With respect to the blanket planarized pre-metal dielectric (PMD) layer 24, although the blanket planarized pre-metal dielectric (PMD) 24 layer may be formed employing methods including but not limited to chemical vapor deposition (CVD) methods, plasma enhanced chemical vapor deposition (PECVD) methods and physical vapor deposition (PVD) sputtering methods, along with reactive ion etch (RIE) etchback planarizing methods and chemical mechanical polish (CMP) planarizing methods, to form the blanket planarized pre-metal dielectric (PMD) layer 24 of a dielectric material selected from the group including but not limited to silicon oxide dielectric materials, silicon nitride dielectric materials and silicon oxynitride dielectric materials, for the preferred embodiment of the present invention, the blanket planarized pre-metal dielectric (PMD) layer 24 is preferably formed of a silicon oxide dielectric material deposited employing a plasma enhanced chemical vapor deposition (PECVD) method and subsequently planarized employing a chemical mechanical polish (CMP) planarizing method, as is conventional in the art of microelectronics fabrication. Preferably, the blanket planarized pre-metal dielectric (PMD) layer is formed to a thickness of about 10000 angstroms.

With respect to the patterned first conductor layers 26a, 26b and 26c, although the patterned first conductor layers 26a, 26b and 26c may be formed employing conductor materials including but not limited to metal, metal alloy, doped polysilicon and polycide (doped polysilicon/metal silicide stack) conductor materials, the patterned first conductor layers 26a, 26b and 26c are typically and preferably formed employing an aluminum containing conductor material, as is similarly conventional in the art of microelectronics fabrication. Preferably, each of the patterned first conductor layers 26a, 26b and 26c is formed to a thickness H of from about 5500 to about 6500 angstroms, a linewidth W1 of from about 0.4 to about 0.5 microns and pitch dimension W2 of from about 0.4 to about 0.5 microns, as illustrated within FIG. 1.

Referring now to FIG. 2, there is shown a schematic cross-sectional diagram illustrating the results of further processing of the integrated circuit microelectronics fabrication whose schematic cross-sectional diagram is illustrated in FIG. 1. Shown in FIG. 2 is a schematic cross-sectional diagram of an integrated circuit microelectronics fabrication otherwise equivalent to the integrated circuit microelectronics fabrication whose schematic cross-sectional diagram is illustrated in FIG. 1, but wherein there is formed upon the series of patterned first conductor layers 26a, 26b and 26c, and portions of the blanket planarized pre-metal dielectric (PMD) layer 24 exposed adjoining the series of patterned first conductor layers 26a, 26b and 26c, a conformal silicon nitride layer 28. Within the preferred embodiment of the present invention, the conformal silicon nitride layer 28 serves as a barrier layer to attenuate high density plasma induced degradation of the field effect transistor (FET) and the polysilicon resistor 22 formed beneath the conformal silicon nitride layer 28 when forming over the conformal silicon nitride layer a high density plasma chemical vapor deposited (HDP-CVD) dielectric layer. The deposition conditions employed when forming the conformal silicon nitride layer 28 are selected to effect that result while comparatively minimally, if at all, inducing degradation of the field effect transistor (FET) or the polysilicon resistor 22 when forming the conformal silicon nitride layer 28.

Thus, although there may in general be employed several methods for forming within microelectronics fabrications silicon nitride layers, in order to provide characteristics desired within the present invention, for the preferred embodiment of the present invention it has been determined experimentally that the conformal silicon nitride layer 28 is preferably formed employing a plasma enhanced chemical vapor deposition (PECVD) method other than a high density plasma chemical vapor deposition (HDP-CVD) method, where the plasma enhanced chemical vapor deposition (PECVD) method in turn employs silane (SiH4) as a silicon source material and nitrogen (N2) as a nitrogen source material.

Preferably, the plasma enhanced chemical vapor deposition (PECVD) method also employs: (1) a reactor chamber pressure of from about 3 to about 5 torr; (2) a source radio frequency power of from about 80 to about 120 watts at a source radio frequency of 13.56 MHZ; (3) a semiconductor substrate 10 temperature of from about 380 to about 400 degrees centigrade; (4) a silane flow rate of from about 20 to about 30 standard cubic centimeters per minute (sccm); and (5) a nitrogen flow rate of from about 1400 to about 1600 standard cubic centimeters per minute (sccm). Preferably, the conformal silicon nitride layer 28 is formed to a thickness of from about 300 to about 700 angstroms.

Referring now to FIG. 3, there is shown a schematic cross-sectional diagram illustrating the results of further processing of the integrated circuit microelectronics fabrication whose schematic cross-sectional diagram is illustrated in FIG. 2. Shown in FIG. 3 is a schematic cross-sectional diagram of an integrated circuit microelectronics fabrication otherwise equivalent to the integrated circuit microelectronics fabrication whose schematic cross-sectional diagram is illustrated in FIG. 2, but wherein there is formed upon the conformal silicon nitride layer 28 a blanket inter-metal dielectric (IMD) layer 30. Within the preferred embodiment of the present invention, the blanket inter-metal dielectric (IMD) layer 30 is formed employing a high density plasma chemical vapor deposition (HDP-CVD) method. Although several dielectric materials may be formed employing high density plasma chemical vapor deposition (HDP-CVD) methods, including dielectric materials selected from the group including but not limited to silicon oxide dielectric materials, silicon nitride dielectric materials and silicon oxynitride dielectric materials, for the preferred embodiment of the present invention the blanket inter-metal dielectric (IMD) layer 30 is preferably formed of a silicon oxide dielectric material formed employing silane as a silicon source material and oxygen as an oxidant source material, along with an argon sputtering gas component as is conventionally employed within a high density plasma chemical vapor deposition (HDP-CVD) method.

Preferably, the high density plasma chemical vapor deposition (HDP-CVD) method also employs: (1) a reactor chamber pressure of from about 4 to about 6 mtorr; (2) a source radio frequency power at top of from about 1200 to about 1400 watts and at side of from about 3000 to about 3200 watts at a source radio frequency of 13.56 MHZ; (3) a bias power of from about 3000 to about 3500 watts; (4) a silane flow rate of from about 60 to about 80 standard cubic centimeters per minute (sccm); (5) an oxygen oxidant gas flow rate of from about 130 to about 140 standard cubic centimeters per minute (sccm); and (6) an argon sputtering component flow rate of from about 120 to about 130 standard cubic centimeters per minute (sccm). Preferably, the blanket inter-metal dielectric (IMD) layer 30 is formed to a thickness of from about 8000 to about 10000 angstroms.

Upon forming the integrated circuit microelectronics fabrication whose schematic cross-sectional diagram is illustrated in FIG. 3, there is formed an integrated circuit microelectronics fabrication having formed therein a field effect transistor (FET) and a polysilicon resistor, where when there is formed over the field effect transistor (FET) and the polysilicon resistor a dielectric layer formed employing a high density plasma chemical vapor deposition (HDP-CVD) method there is attenuated degradation of the field effect transistor (FET) and the polysilicon resistor. Degradation of the field effect transistor (FET) is typically, although not exclusively, evidenced as compromise of field effect transistor (FET) operating parameters, such as but not limited to transconductance and gate dielectric layer breakdown voltage, while degradation of the polysilicon resistor is typically, although not exclusively, exhibited as a decrease in polysilicon resistor resistance.

While not necessarily wishing to be held to any single particular theory as to the mechanism through which the present invention operates, it is believed that the attenuation of degradation of the field effect transistor (FET) performance typically derives from physical shielding by the conformal silicon nitride layer 28 of patterned first conductor layers 26a, 26b and 26c, from electrical discharge sputtering effects incident to forming the blanket inter-metal dielectric (IMD) layer 30, while attenuated degradation of the polysilicon resistor 22 is believed to derive from attenuated diffusion through the conformal silicon nitride layer 28 of mobile species, such as but not limited to hydrogen, which mobile species would otherwise ultimately diffuse into the polysilicon resistor 22 and presumably upon reaction with the polysilicon resistor thus compromise the resistance of the polysilicon resistor 22.

EXAMPLES

Three series of semiconductor substrates were obtained and there was formed upon each semiconductor substrate within the three series of semiconductor substrates an integrated circuit structure analogous to the integrated circuit structure whose schematic cross-sectional diagram is illustrated in FIG. 1. Within each integrated circuit structure was formed a field effect transistor (FET) of gate electrode linewidth dimension about 0.35 microns, formed and aligned upon a thermal silicon oxide gate dielectric layer of thickness about 65 angstroms. There was similarly formed within each integrated circuit structure a polysilicon resistor formed upon a thermal silicon oxide isolation region of thickness about 4000 angstroms and areal dimensions about 0.6 microns by about 0.6 microns. Each polysilicon resistor was doped with an arsenic dopant at a dosage of about 6E13 ions per square centimeter to form the polysilicon resistor with a nominal sheet resistance of about 260 ohms per square.

Formed upon the field effect transistor (FET) structures and the polysilicon resistors within each integrated circuit structure within the three series of semiconductor substrates was a blanket planarized pre-metal dielectric (PMD) layer which in turn had formed thereupon a series of patterned first conductor layers. Similarly with the preferred embodiment of the present invention, the blanket planarized pre-metal dielectric (PMD) layer was formed of a silicon oxide dielectric material formed employing a plasma enhanced chemical vapor deposition (PECVD) method. The blanket planarized pre-metal dielectric (PMD) layer was planarized employing a chemical mechanical polish (CMP) planarizing method to form the blanket planarized pre-metal dielectric layer of thickness about 10000 angstroms. Also similarly with the preferred embodiment of the present invention, the patterned conductor layers were formed of an aluminum alloy conductor material formed to a thickness of about 6000 angstroms, a linewidth of about 0.45 microns and a pitch dimension of about 0.45 microns, where the patterned first conductor layers accessed the field effect transistor (FET) structures and the polysilicon resistors.

A first of the three series of semiconductor substrates then had formed thereupon a conformal silicon oxide dielectric layer formed employing a plasma enhanced chemical vapor deposition (PECVD) method. The plasma enhanced chemical vapor deposition (PECVD) method employed: (1) a reactor chamber pressure of about 2.2 torr; (2) a radio frequency power of about 115 watts at a radio frequency of 13.56 MHZ, with a matching radio frequency component of about 65 watts; (3) a semiconductor substrate temperature of about 400 degrees centigrade; (4) a silane flow rate of about 85 standard cubic centimeters per minute (sccm); and (5) an oxygen oxidant gas flow rate of about 2200 standard cubic centimeters per minute (sccm). The plasma enhanced chemical vapor deposited (PECVD) silicon oxide dielectric layers were formed to a thickness of about 3000 angstroms.

Formed upon the plasma enhanced chemical vapor deposited silicon oxide dielectric layers was a series of spin-on-glass (SOG) dielectric layers formed of a silicate spin-on-glass (SOG) dielectric material available from Allied-Signal Corp. as SOG 214 spin-on-glass (SOG) dielectric material. The spin-on-glass (SOG) dielectric layers were thermally cured at a temperature of about 425 degrees centigrade for a time period of about one hour. The spin-on-glass (SOG) silicon oxide dielectric layers were then etched back employing a reactive ion etch (RIE) method employing a carbon tetrafluoride, trifluoromethane and argon etchant gas composition, as is common in the art of microelectronics fabrication, to form a reactive ion etch (RIE) etched spin-on-glass (SOG) silicon oxide dielectric layer of thickness about 3000 angstroms formed upon the plasma enhanced chemical vapor deposited (PECVD) silicon oxide dielectric layer within areal dense metal areas.

The reactive ion etch (RIE) etchback method also employed: (1) a reactor chamber pressure of about 300 mtorr; (2) a source radio frequency power of about 1070 watts at a source radio frequency of 13.56 MHZ; (3) a sputtering component at a DC bias of about 1000 volts; (4) a carbon tetrafluoride flow rate of about 15 standard cubic centimeters per minute (sccm); (5) a trifluoromethane flow rate of about 45 standard cubic centimeters per minute (sccm); and (6) an argon flow rate of about 145 standard cubic centimeters per minute (sccm).

Upon a second series of semiconductor substrates was formed a high density plasma chemical vapor deposited (HDP-CVD) silicon oxide dielectric layer formed upon a plasma enhanced chemical vapor deposited (PECVD) silicon nitride layer in turn formed upon the series of patterned first conductor layers and portions of the blanket planarized pre-metal dielectric (PMD) layers exposed adjoining the series of patterned first conductor layers, in accord with the preferred embodiment of the present invention.

The plasma enhanced chemical vapor deposited (PECVD) silicon nitride layer was formed employing silane as a silicon source material and nitrogen as a nitrogen source material. The plasma enhanced chemical vapor deposition (PECVD) method also employed: (1) a reactor chamber pressure of about 4 torr; (2) a source radio frequency power of about 100 watts at a source radio frequency of 13.56 MHZ, without a bias sputtering component; (3) a semiconductor substrate temperature of about 390 degrees centigrade; (4) a silane flow rate of about 25 standard cubic centimeters per minute (sccm); and (6) a nitrogen flow rate of about 1500 standard cubic centimeters per minute (sccm). The plasma enhanced chemical vapor deposited (PECVD)

silicon nitride layer was formed conformally upon the series of patterned first conductor layers and portions of the blanket planarized pre-metal dielectric (PMD) layer exposed adjoining the series of patterned first conductor layers to a thickness of about 500 angstroms.

Formed upon the plasma enhanced chemical vapor deposited (PECVD) silicon nitride layer was the silicon oxide dielectric layer formed employing a high density plasma chemical vapor deposition (HDP-CVD) method which in turn employed silane as the silicon source material and oxygen as the oxidant source material. The high density plasma chemical vapor deposition (HDP-CVD) method also employed: (1) a reactor chamber pressure of about 5 mtorr; (2) a source radio frequency power at top of about 1300 watts and at side of about 3100 watts at a source radio frequency of 13.56 MHZ; (3) a bias sputtering power of about 3500 watts; (4) a semiconductor substrate temperature of about 375 degrees centigrade; (5) a silane flow rate of about 75 standard cubic centimeters per minute (sccm); (6) an oxygen flow rate of about 136 standard cubic centimeters per minute (sccm); and (7) an argon flow rate of about 126 standard cubic centimeters per minute (sccm). The high density plasma chemical vapor deposited (HDP-CVD) silicon oxide layer was formed to a thickness of about 8000 angstroms upon the plasma enhanced chemical vapor deposited (PECVD) silicon nitride layer.

Upon the third series of semiconductor substrates was formed the high density plasma chemical vapor deposited (HDP-CVD) silicon oxide layer in accord with the process parameters employed in forming the high density plasma chemical vapor deposited (HDP-CVD) silicon oxide layers as formed upon the second series of semiconductor substrates, but without having formed thereunder the conformal silicon nitride layer formed employing the plasma enhanced chemical vapor deposition (PECVD) method.

For the three series of field effect transistors formed upon each of the three series semiconductor substrates there was then measured a gate dielectric layer breakdown voltage and for the three series of polysilicon resistors formed upon the three series of semiconductor substrates there was then measured a polysilicon resistor resistance. The measured values of the breakdown voltages and the polysilicon resistor resistances are reported in Table I as a function of inter-metal dielectric (IMD) layer structure. For references purposes, for each of the three series of field effect transistors (FETs) formed upon the three semiconductor substrates there was a patterned conductor layer to field effect transistor (FET) structure antenna ratio of about 113,000:1. Similarly, there was also a corresponding perimeter ratio of about 431:1. Breakdown voltages were determined as a 50 percent cumulative probability of a field effect transistor (FET) leakage exceeding 1 milliamp.

TABLE I

| IMD Layer Structure | FET Breakdown Voltage (volts) | Polysi Resistance (ohms) |
| --- | --- | --- |
| PE-SiH4/SOG Etchback | 12 +/− 1 | 140 +/− 50 |
| PE-SiN/HDP-CVD SiO2 | 12.5 +/− 1 | 50 +/− 20 |
| HDP-CVD SiO2 | 8 +/− 1 | 0.56 +/− 0.50 |

From review of the data of Table I, it is seen that field effect transistor (FET) breakdown voltages and polysilicon resistor resistances are increased when employing as an inter-metal dielectric (IMD) layer a silicon oxide dielectric layer formed employing a high density plasma chemical vapor deposition (HDP-CVD) method in turn formed upon a silicon nitride layer formed employing a plasma enhanced chemical vapor deposition (PECVD) method, in accord with the preferred embodiment of the present invention, in comparison with an otherwise equivalent inter-metal dielectric (IMD) layer formed absent the silicon nitride layer formed employing the plasma enhanced chemical vapor deposition (PECVD) method. The inter-metal dielectric layer formed in accord with the preferred embodiment of the present invention provides field effect transistor operating parameters and polysilicon resistor resistances similar to those obtained employing a spin-on-glass (SOG) planarization and reactive ion etch (RIE) etchback method conventional in the art of integrated circuit microelectronics fabrication.

As is understood by a person skilled in the art, the preferred embodiment and examples of the present invention are illustrative of the present invention rather than limiting of the present invention. Revisions and modifications may be made to methods, materials, structures and dimensions through which is formed a high density plasma chemical vapor deposited (HDP-CVD) dielectric layer in accord with the preferred embodiment and examples of the present invention while still forming a high density plasma chemical vapor deposited (HDP-CVD) dielectric layer in accord with the present invention, as defined within the appended claims.

What is claimed is:

1. A method for forming a dielectric layer within a microelectronics fabrication comprising:

providing a substrate;

forming over the substrate a polysilicon resistor;

forming over the polysilicon resistor a first dielectric layer formed of a silicon nitride dielectric material deposited employing a plasma enhanced chemical vapor deposition (PECVD) method other than a high density plasma chemical vapor deposition (HDP-CVD) method; and forming over the first dielectric layer a second dielectric layer deposited employing a high density plasma chemical vapor deposition (HDP-CVD) method, where first dielectric layer attenuates a decrease in resistance of the polysilicon resistor incident to forming the second dielectric layer over the first dielectric layer.

2. The method of claim 1 wherein the substrate is employed within a microelectronics fabrication selected from the group consisting of integrated circuit microelectronics fabrications, solar cell microelectronics fabrications, ceramic substrate microelectronics fabrications and flat panel display microelectronics fabrications.

3. The method of claim 1 wherein the first dielectric layer is formed at a source radio frequency power of from about 80 to about 120 watts, without employing a bias power for sputtering the first dielectric layer when forming the first dielectric layer.

4. The method of claim 1 wherein:

the second dielectric layer is a silicon oxide dielectric layer; and the high density plasma chemical vapor deposition (HDP-CVD) method employs silane as a silicon source material.

5. The method of claim 1 wherein the first dielectric layer attenuates a decrease in resistance of the polysilicon resistor incident to forming the second dielectric layer over the first dielectric layer by providing a diffusion barrier for mobile species formed incident to the high density plasma chemical vapor deposition (HDP-CVD) method.

6. A method for forming a dielectric layer within an integrated circuit microelectronics fabrication comprising:

providing a semiconductor substrate;

forming upon the semiconductor substrate a field effect transistor (FET);

forming over the semiconductor substrate a polysilicon resistor;

forming over the polysilicon resistor and the field effect transistor (FET) a first dielectric layer formed of a silicon nitride dielectric material deposited employing a plasma enhanced chemical vapor deposition (PECVD) method other than a high density plasma chemical vapor deposition (HDP-CVD) method; and forming over the first dielectric layer a second dielectric layer deposited employing a high density plasma chemical vapor deposition (HDP-CVD) method, where first dielectric layer attenuates a decrease in resistance of the polysilicon resistor incident to forming the second dielectric layer over the first dielectric layer and attenuates a decrease in breakdown voltage of a gate dielectric layer within the field effect transistor (FET) incident to forming the second dielectric layer over the first dielectric layer.

7. The method of claim 6 wherein the first dielectric layer is formed at a source radio frequency power of from about 80 to about 120 watts, without employing a bias power for sputtering the first dielectric layer when forming the first dielectric layer.

8. The method of claim 6 wherein:

the second dielectric layer is a silicon oxide dielectric layer; and the high density plasma chemical vapor deposition (HDP-CVD) method employs silane as a silicon source material.

9. The method of claim 6 wherein:

the first dielectric layer attenuates the decrease in resistance of the polysilicon resistor incident to forming the second dielectric layer over the first dielectric layer by providing a diffusion barrier for mobile species formed incident to the high density plasma chemical vapor deposition (HDP-CVD) method; and the first dielectric layer attenuates the decrease in breakdown voltage of the gate dielectric layer within the field effect transistor (FET) by providing a physical barrier to high density plasma induced electrical discharge incident to the high density plasma chemical vapor deposition (HDP-CVD) method.

* * * * *